(12) United States Patent
Whitaker et al.

(10) Patent No.: US 7,576,562 B1
(45) Date of Patent: Aug. 18, 2009

(54) DIAGNOSABLE STRUCTURED LOGIC ARRAY

(75) Inventors: Sterling Whitaker, Albuquerque, NM (US); Lowell Miles, Albuquerque, NM (US); Jody Gambles, Post Falls, ID (US); Gary K. Maki, Coeur D'Alene, ID (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 11/818,845

(22) Filed: Jun. 15, 2007

Related U.S. Application Data

(60) Provisional application No. 60/815,020, filed on Jun. 19, 2006.

(51) Int. Cl.
*H03K 19/173* (2006.01)

(52) U.S. Cl. .......................................... 326/40; 326/46

(58) Field of Classification Search .................. 326/40, 326/46, 38; 327/407; 365/189.02, 230.02
See application file for complete search history.

(56) References Cited

U.S. PATENT DOCUMENTS

| | | | |
|---|---|---|---|
| 4,783,778 A | 11/1988 | Finch et al. | 370/60 |
| 4,787,057 A | 11/1988 | Hammond | 364/754 |
| 4,888,774 A | 12/1989 | Kosuge et al. | 371/38.1 |
| 5,278,781 A | 1/1994 | Aono et al. | 364/736 |
| 5,398,322 A | 3/1995 | Marwood | 395/400 |
| 5,673,407 A | 9/1997 | Poland et al. | 395/375 |
| 5,867,414 A | 2/1999 | Kao | 364/754.02 |
| 6,262,597 B1 * | 7/2001 | Bauer et al. | 326/41 |
| 6,556,045 B2 * | 4/2003 | Cohen | 326/46 |
| 6,597,745 B1 | 7/2003 | Dowling | 375/296 |
| 6,696,873 B2 | 2/2004 | Hazucha et al. | 327/203 |
| 6,725,411 B1 | 4/2004 | Gerlach et al. | 714/755 |
| 6,757,122 B1 | 6/2004 | Kuznetsov et al. | 360/53 |
| 6,826,090 B1 | 11/2004 | Chu et al. | 365/189.05 |
| 6,895,547 B2 | 5/2005 | Eleftheriou et al. | 714/801 |
| 6,928,602 B2 | 8/2005 | Yamagishi et al. | 714/781 |
| 7,069,492 B2 | 6/2006 | Piret | 714/762 |
| 7,111,221 B2 | 9/2006 | Birru et al. | 714/755 |
| 7,127,653 B1 | 10/2006 | Gorshe | 714/746 |
| 7,162,684 B2 | 1/2007 | Hocevar | 714/800 |

* cited by examiner

*Primary Examiner*—Daniel D Chang

(57) ABSTRACT

A diagnosable structured logic array and associated process is provided. A base cell structure is provided comprising a logic unit comprising a plurality of input nodes, a plurality of selection nodes, and an output node, a plurality of switches coupled to the selection nodes, where the switches comprises a plurality of input lines, a selection line and an output line, a memory cell coupled to the output node, and a test address bus and a program control bus coupled to the plurality of input lines and the selection line of the plurality of switches. A state on each of the plurality of input nodes is verifiably loaded and read from the memory cell. A trusted memory block is provided. The associated process is provided for testing and verifying a plurality of truth table inputs of the logic unit.

23 Claims, 10 Drawing Sheets

US 7,576,562 B1

DIAGNOSABLE STRUCTURED LOGIC ARRAY

RELATED APPLICATIONS

This application claims benefit of priority to U.S. Provisional Patent Applications, Ser. No. 60/815,020 filed Jun. 19, 2006, and entitled "DIAGNOSABLE STRUCTURED LOGIC ARRAY," which is incorporated herein in its entirety by reference.

The present invention was developed pursuant to a government contract having NASA grant number NNG06GB45G.

FIELD OF THE INVENTION

The present invention relates to the field of integrated circuit (IC) architectures. More particularly, the present invention relates to integrated circuits with a diagnosable structured logic array.

BACKGROUND

Fabricationless semiconductor companies or entities utilize commercial computer aided design (CAD) tools, foundry services, packaging, and final test facilities within other companies and even other countries. Little effort is made today to insure that a design implemented and released for fabrication is the same design as originally created. For a number of reasons, some of which are clandestine, the design can be altered. Governments can be especially sensitive to such a practice regarding homeland defense electronics.

In today's environment where CAD tools, fabrication, packaging and test can all be accomplished in locations or with tools outside the control of a designer, it is possible for "extra" logic to be inserted for clandestine purposes. For example, an outside entity may wish to insert extra logic to monitor or introduce new control modes within a real time processor. Or a foreign government may desire to insert extra logic for strategic military purposes.

Accordingly, it is desirable to create a hardware structure that allows the designer to determine if extra electronics has been inserted into a design.

SUMMARY OF THE INVENTION

In accordance with a first aspect of the present invention, a base cell structure is provided. The base cell includes a logic unit with a plurality of input nodes, a plurality of selection nodes, and an output node. A plurality of switches are coupled to the selection nodes, where the switches include a plurality of input lines, a selection line and an output line. A memory cell is coupled to the output node. A test address bus and a program control bus are also coupled to the plurality of input lines and the selection line of the plurality of switches wherein a state on each of the plurality of input nodes is verifiably loaded and read from the memory cell. The base cell structure can further include a test enable signal coupled to the selection line of the plurality of switches. Further, the logic unit can comprise an 8×1 multiplexer. The plurality of switches can comprise 2×1 multiplexers.

In accordance with a second aspect of the present invention, a trusted memory block is provided. The trusted memory block comprises a plurality of switches including a plurality of input lines, a selection line and an output line. A scan D flip flop is coupled to the output line of one of the plurality of switches. A plurality of selection node input signals and a scan data signal are coupled to the plurality of input lines and a plurality of memory test address signals and a scan select signal are coupled to the selection line of the plurality of switches. The trusted memory block can include a buffer circuit following the scan D flip flop. In addition, the plurality of switches can comprise a triad of 2 to 1 multiplexers that are arranged in tandem.

In accordance with another aspect of the present invention, a logic structure is provided. The logic structure comprises an array of trusted logic blocks and an array of trusted memory blocks. The array of trusted logic blocks includes a logic unit comprising a plurality of input nodes, a plurality of selection nodes, and an output node. A plurality of switches are coupled to the selection nodes, where the switches comprise a plurality of input lines, a selection line and an output line. A test address bus and a program control bus are coupled to the plurality of input lines and the selection line of the plurality of switches. The array of trusted memory blocks include a plurality of switches comprising a plurality of input lines, a selection line and an output line. A scan D flip flop is coupled to the output line of one of the plurality of switches. A plurality of selection node input signals and a scan data signal are coupled to the plurality of input lines and a plurality of memory test address signals and a scan select signal are coupled to the selection line of the plurality of switches. The logic structure includes logic blocks of the array of trusted logic blocks arranged in tandem with each memory block of the array of trusted memory blocks. Also, the logic unit of the array of trusted logic blocks can comprise an 8×1 multiplexer. A buffer circuit can follow each of the logic units and scan D flip flops. In an exemplary embodiment, the logic structure includes non-logic structures occupying a space of the logic structure that is devoid of active logic circuits. The non-logic structures can comprise filter capacitors. Additionally, the logic structure can include 9× buffers and 3× buffers on a periphery of the logic structure.

In accordance with yet another aspect of the present invention, an application specific integrated circuit (ASIC) structure is provided. The ASIC structure comprises an array of base groups and a plurality of input pins and output pins in communication with each base group. Each of the base groups includes a logic structure comprising an array of trusted logic blocks and an array of trusted memory blocks. The array of trusted logic blocks include a logic unit comprising a plurality of input nodes, a plurality of selection nodes, an output node, and a plurality of switches coupled to the selection nodes. The switches include a plurality of input lines, a selection line and an output line. A test address bus and a program control bus are coupled to the plurality of input lines and the selection line of the plurality of switches. The array of trusted memory blocks includes a plurality of switches comprising a plurality of input lines, a selection line and an output line. A scan D flip flop is coupled to the output line of one of the plurality of switches. A plurality of selection node input signals and a scan data signal are coupled to the plurality of input lines and a plurality of memory test address signals and a scan select signal are coupled to the selection line of the plurality of switches. In one embodiment, each logic block of the array of trusted logic blocks can be arranged in tandem with each memory block of the array of trusted memory blocks. Also, the logic unit of the array of trusted logic blocks can comprise an 8×1 multiplexer. In another embodiment, the ASIC structure includes non-logic structures occupying a space of the ASIC structure that is devoid of active logic circuits. The non-logic structures can comprise filter capacitors.

In accordance with still another aspect of the present invention, a process of testing and verifying a plurality of truth table inputs of a logic structure is provided. The process comprises loading a test pattern into a chain of memory blocks configured into a scan chain. A test address is loaded to a plurality of logic units. A test enable signal is set to a high. The test pattern is unloaded from the chain of memory blocks of the scan chain. The chain of memory blocks can comprise a plurality of switches comprising a plurality of input lines, a selection line and an output line, a scan D flip flop coupled to the output line of one of the plurality of switches, and a plurality of selection node input signals and a scan data signal are coupled to the plurality of input lines and a plurality of memory test address signals and a scan select signal are coupled to the selection line of the plurality of switches. The process can include testing a capacitance of the logic structure and determining a change in capacitance from an expected capacitance.

Other features of the present invention will become apparent from consideration of the following description taken in conjunction with the accompanying drawings.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

Figures 1, 1A:
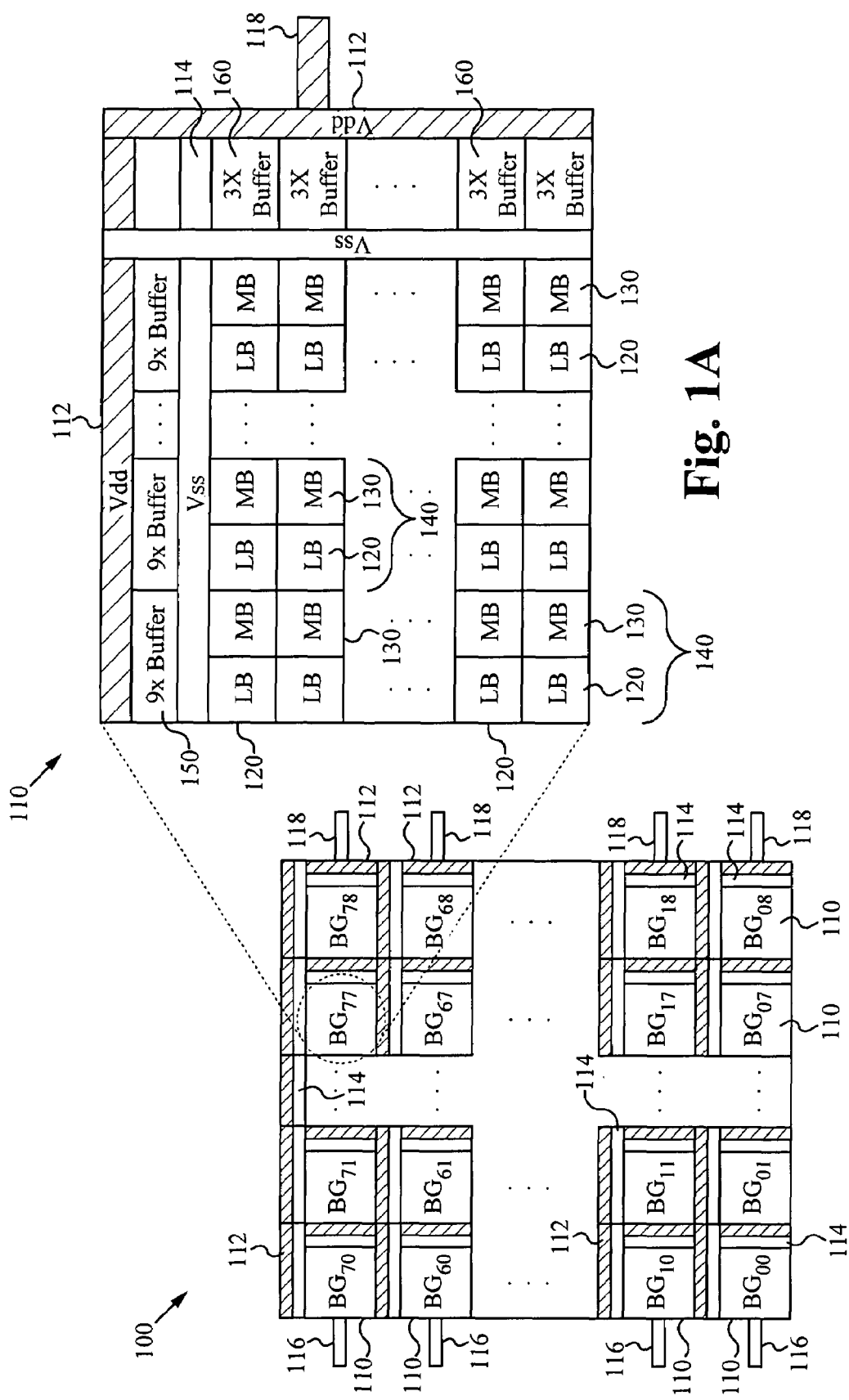
FIG. 1 illustrates a functional block diagram of a diagnosable structured ASIC array in accordance with an embodiment of the invention.
FIG. 1A illustrates a detail view of a base group of the structured ASIC array.

Turning to FIG. 1, a functional block diagram for IC chip core 100 according to the present invention is shown. The IC chip core 100 comprises an Application Specific Integrated Circuit (ASIC) structure that can selectively be customized for a particular purpose or for general purpose use. The IC chip core 100 generally comprises an array of base groups 110 arranged in a two dimensional pattern. The IC chip core 100 includes a plurality of input pins 116 and a plurality of output pins 118. The number of base groups 110 utilized for the IC chip core 100 can vary. In an exemplary embodiment, the IC chip core 100 utilizes an 8×8 array of base groups 110 though it will be apparent that any size array can be used. The IC chip core 100 includes power signals Vdd 112 and Vss 114 routed throughout the IC chip core 100 to each base group 110. The input pins 116 and output pins 118 couple with routing channels or a group of signal wires, such as a bus, (not shown) which is routed throughout each base group 110.

FIG. 1A shows a more detailed view of the base group 110. The base group 110 generally comprises an array of base cells 140 duplicated throughout the base group 110 and the power signals Vdd/Vss 112,114 respectively. The base group 110 also includes 9× buffers 150 and 3× buffers 160 configured between the power signals Vdd/Vss 112, 114. Alternatively, the base group 110 can include filter capacitors (not shown) or other non-active elements between the power signals Vdd/Vss 112, 114. The presence or removal of the capacitors (not shown) can be verified by testing the capacitance between the power signals Vdd/Vss 112,114. The base cell 140 can serve as a standard cell for use in standard cell methodology to design ASIC devices. Generally, a standard cell 140 comprises a group of transistors arranged to provide a boolean logic function or a storage function. The base cell 140 can be duplicated and arranged in an array to form a core of a structured ASIC circuit such as the IC chip core 100. The base cell 140 can be configured as a very dense standard cell by utilizing a selection algebra that optimizes a layout of the logic gates (not shown) comprising the base cell 140, described in further detail in U.S. Pat. Nos. 6,779,158 and 6,792,589 both of which are hereby incorporated by reference. Also see S. Whitaker, L. Miles, J. Gambles, G. Donohoe and L. Davis, *High Density Standard Cell Library*, NASA Symposium on VLSI Design, Paper TA5, May 2003.

The base cells 140 comprise a logic block or a trusted logic block 120 in tandem with a memory block or a trusted memory block 130. The logic blocks 120 are configured to perform a logic function as will be described in relation to an embodiment illustrated in FIG. 2. The memory blocks 130 facilitate storage of a logic state, which can be transferred from the logic blocks 120 to the memory blocks 130. The memory block 130 will be described in relation to an embodiment illustrated in FIG. 3. In certain applications of the ASIC structure 100, a number of the logic blocks 120 and the memory blocks 130 are left unused. The unused logic blocks 120 and memory blocks can be configured in some manner so that during testing as explained below they can be observed and controlled. An example of configuration for the unused logic cells 120 and memory block can comprise a shift register.

Figure 2:
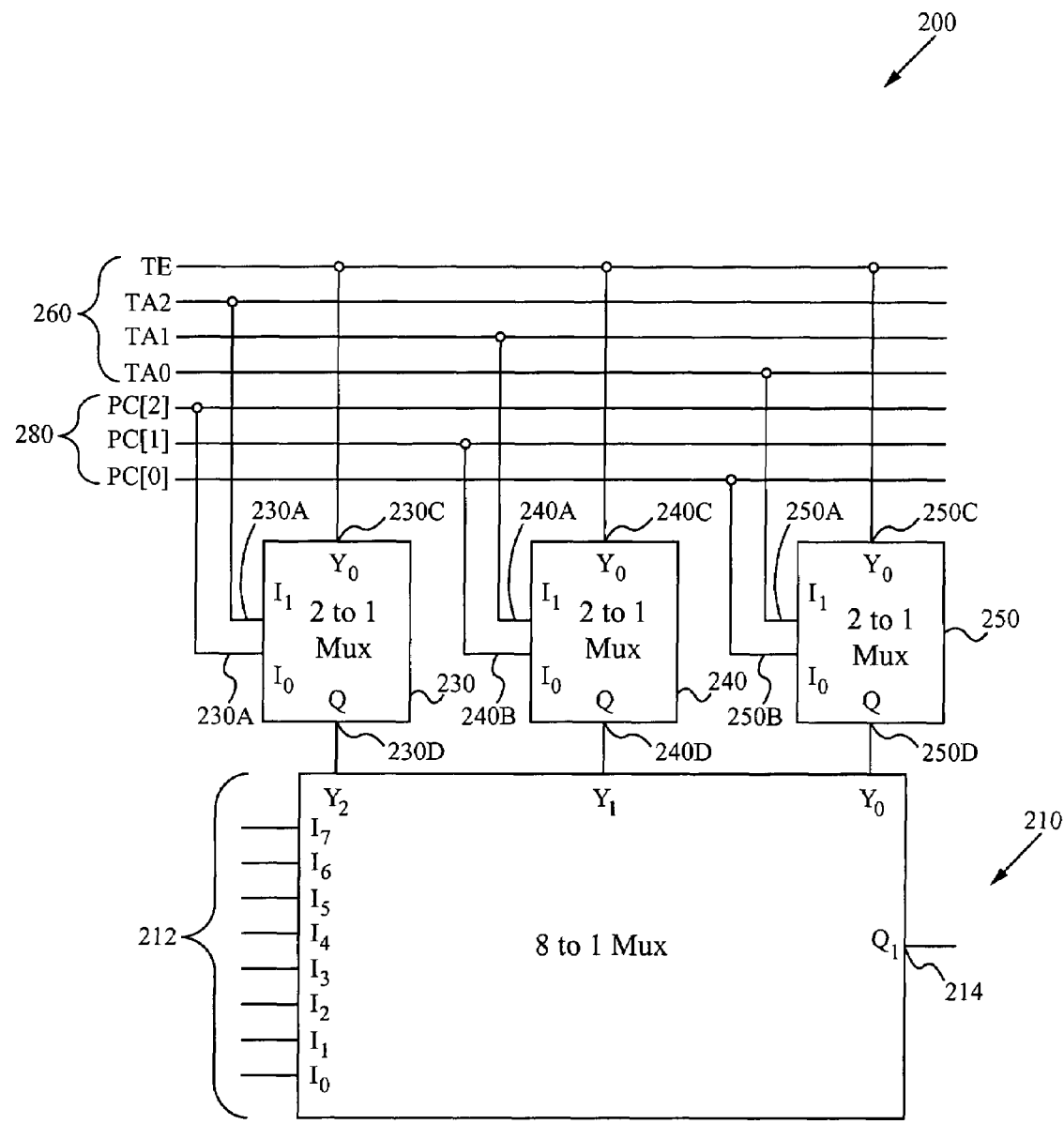
FIG. 2 illustrates a trusted logic block for the diagnosable structured ASIC array.

Turning to FIG. 2, a trusted logic block 200 for a diagnosable structured logic array is shown. The trusted logic block 200 maximizes a controllability of the logic block as will be shown by the description below. The logic block 200 generally includes a logic unit 210 and a plurality of switching units 230, 240, 250. The logic block 200 includes a test bus 260 and a program control bus 280 both routed to the switching units 230, 240, 250. The switching units 230, 240, 250 are in communication with the logic unit 210. Alternatively, the logic block 200 can include a 1× buffer following the logic unit 210. In yet another alternative, the scan D flip flop can be configured to follow the logic unit.

The logic unit 210 can comprise any suitable logic device. In an exemplary embodiment, the logic unit 210 comprises an 8 to 1 multiplexer (Mux) 210. The logic unit 210 includes an input bus 212, a plurality of selector pins Y2,Y1,Y0 and an output pin 214. The input bus 212 comprises a plurality of programmable truth table inputs I7-I0. The truth table inputs I7-I0 can be programmed to implement any number of boolean functions, e.g., AND, OR, XOR, as known by a person of ordinary skill in the art. The inputs I7-I0 are programmed with a logic 1 or 0 by connecting the inputs I7-I0 to Vss or Vdd. Alternatively, the inputs I7-I0 can be driven by a variety of signals. For example, outputs of other flip flops or input signals to the IC chip core 100. The selector pins Y2, Y1, Y0 decode to select a particular truth table input I7-I0, which is then produced at the output pin 214.

The plurality of switching units 230, 240, 250 comprise two input lines each 230A/230B, 240A/240B, 250A/250B, respectively, selector lines 230C, 240C, 250C respectively and outputs 230D, 240D, 250D, respectively. The plurality of switching units 230, 240, 250 comprise logic units capable of passing either a high or low logic signal felt on either of the two input lines 230A/230B, 240A/240B, 250A/250B. In an exemplary embodiment, the switching units 230, 240, 250 each comprise a 2 to 1 multiplexer. The test bus 260 comprises a test enable signal TE, and test address signals TA2-TA0. The test enable signal TE is used to put the base cell 200 into a test mode. The test enable signal TE is coupled to the selection lines 230C, 240C, 250C. The test address signals TA2-TA0 decode to select a particular truth table input I7-I0. The program control bus 280 comprises program control signals PC2-PC0, which decode to select a particular truth table input I7-I0 when the base cell 200 is in a non-test mode. The outputs 230D, 240D, 250D are coupled to the selector pins Y2, Y1, Y0 of the logic unit 210 such that a selector node input signal is felt at each of the selector pins Y2, Y1, Y0.

Figure 3:
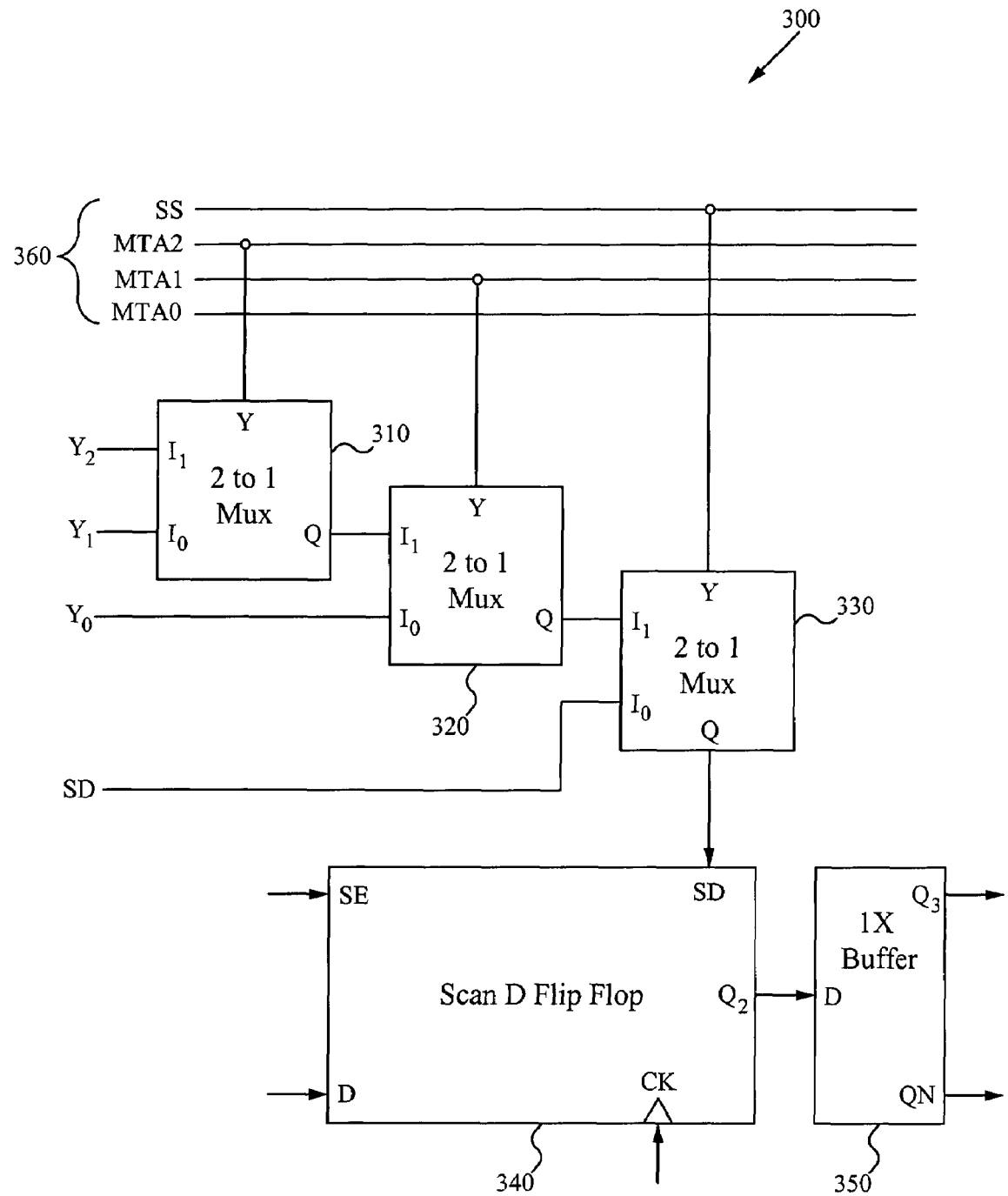
FIG. 3 illustrates a memory block or diagnostic circuit for programmable control signals in accordance with the present invention.

Turning to FIG. 3, a trusted memory block or a diagnostic circuit 300 is shown for the selector pins Y2, Y1, Y0 in accordance with the present invention. The diagnostic circuit 300 facilitates diagnosis and/or observation on a connectivity of the selector pins Y2, Y1, Y0. In this regard, the diagnostic circuit 300 maximizes the ability to determine logic values loaded into the selector pins Y2, Y1, Y0. The diagnostic circuit 300 can be configured in tandem with the trusted logic block 200 to receive the output pin 214 signal of the logic unit 210. The diagnostic circuit 300 generally comprises an array of logic circuits 310, 320, 330 coupled at the scan data pin SD of a scan D flip flop 340. Also included, is a memory test bus 360 comprising memory test address signals MTA2, MTA1, MTA0 and a scan select signal SS. The scan D flip flop 340 includes a 'D' input, a scan enable pin SE, a clock input CK, an output 'Q2' and the scan data pin SD. A 1× buffer 350 is coupled to the output 'Q' of the scan D flip flop 540. In an exemplary embodiment, the logic circuits 310, 320, 330 comprise 2 to 1 multiplexers. The selector pins Y2, Y1, Y0 and a scan data signal SD are used as inputs to the logic circuits 310, 320, 330 as shown. The test address signals TA2, TA1 and a scan select signal SS are used in switching the logic circuits 310, 320, 330. The scan select signal SS is used to put the diagnostic circuit 300 in a test mode. A 'scanned data in' signal SDI is used to scan out data that is entered on the selector pins Y2, Y1, Y0. The scanned out data is scanned into the scan data SD pin of the scan D flip flop 340.

Figure 4:
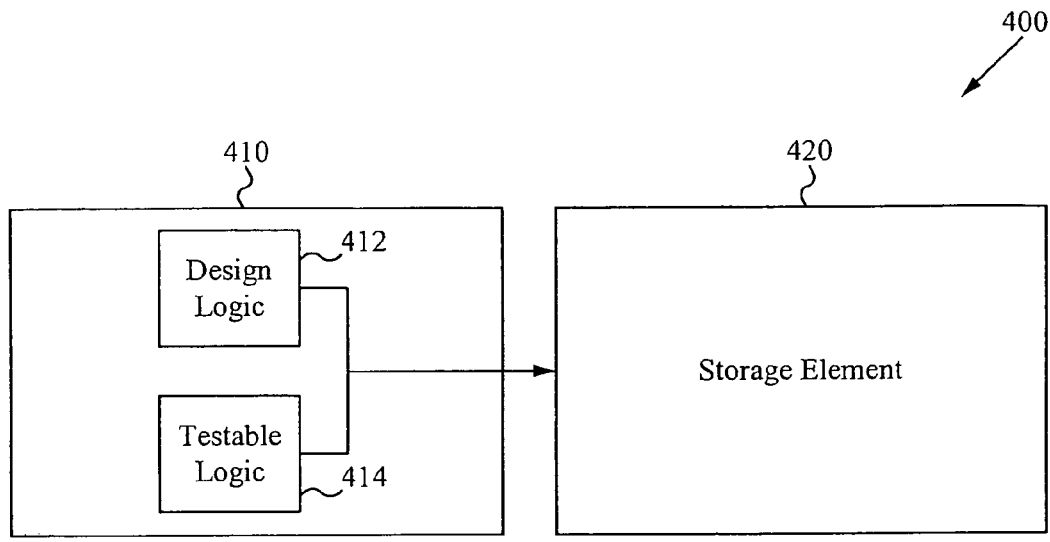
FIG. 4 illustrates a basic structure of a logic cell in accordance with the present invention.
Figure 4A:
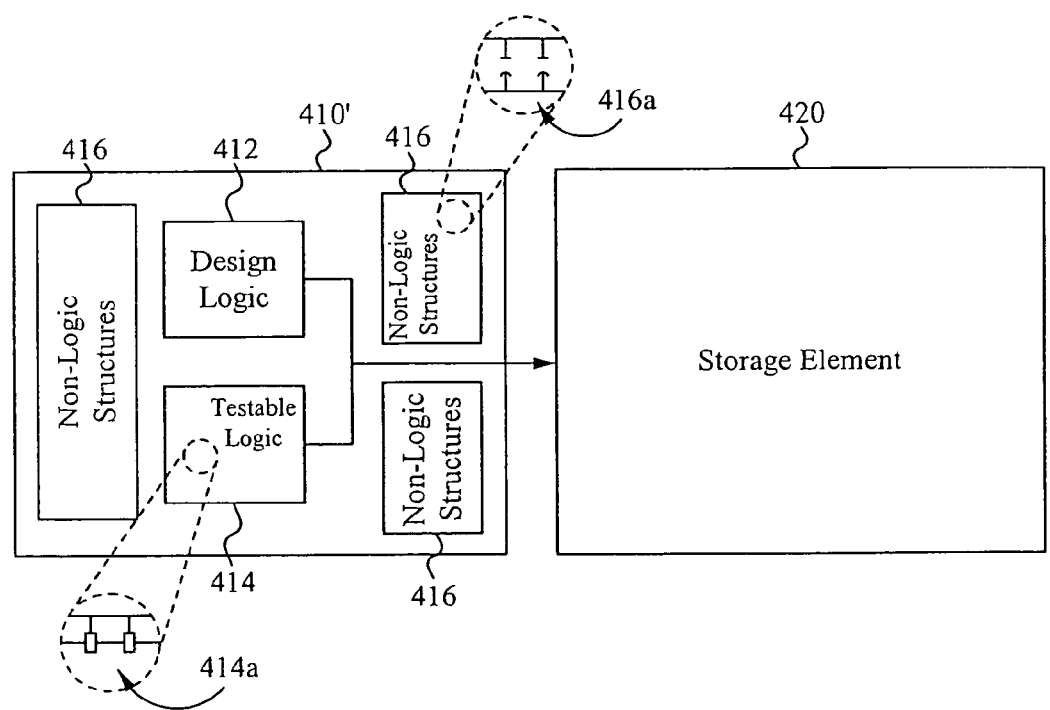
FIG. 4A illustrates an alternative embodiment of a basic structure of a logic cell in accordance with the present invention.

Turning now to FIG. 4, a basic structure of a logic cell 400 in accordance with the present invention is shown. The logic cell 400 comprises a combinational logic block 410 in communication with a storage element 420. The combinational logic block 410 comprises a design logic module 412 and a testable logic module 414. The design logic module 412 comprises active logic circuits (not shown) that implement a basic logic function, e.g., AND, OR, XOR. The testable logic module 414 comprises active logic circuits 414a that implement a testable function, for example, a shift register function. Alternatively, as shown in FIG. 4A, the logic cell 400 comprises a combinational logic block 410' and the storage element 420. The combinational logic block 410' includes non-logic structures 416. The non-logic-structures 416 can occupy the space of the logic block 410' that remains after the design logic module 412 and the testable logic module 414 have been formed. The non-logic structures 416 prevent the insertion of shadow active electronics (not shown) in the logic block 410'. In one embodiment, the non-logic structures 416 can comprise metal filler (not shown) that will render the insertion of shadow active electronics ineffective since no metal interconnects could be used to bring a shadow signal to the shadow electronics. Further, an attempt by an external agent to "cut out" a section of metal, which is below metal that is visually observable, would be ineffective for the same reason of being surrounded by metal. Alternatively, the non-logic structures 416 can comprise filter capacitors 416a. The filter capacitors 416a are configured using methods known to a person of skill in the art.

Figure 5:
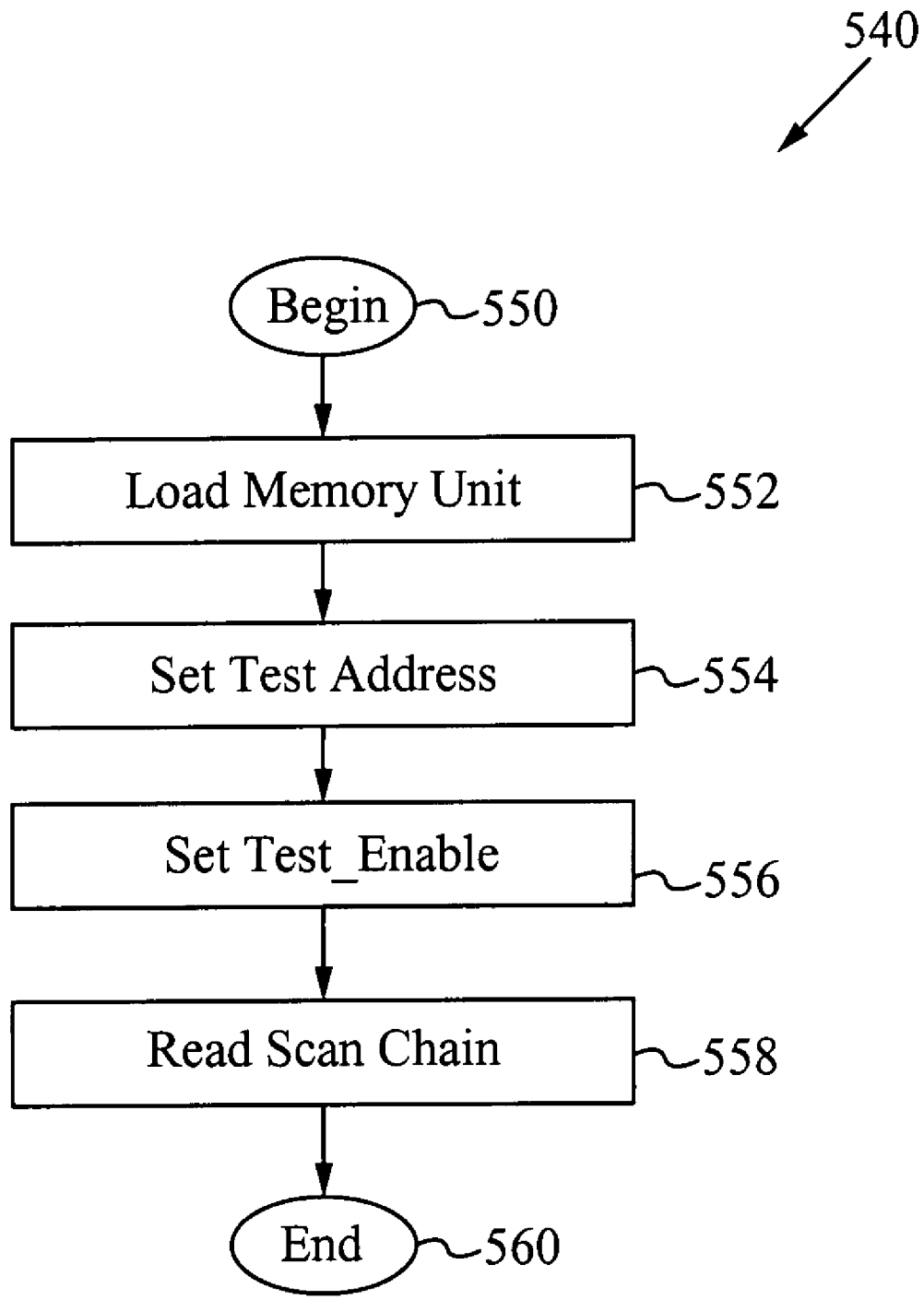
FIG. 5 illustrates a process flow diagram for a testing process of the base cell in accordance with the present invention.

Turning to FIG. 5, a process flow diagram is illustrated for a testing process 540 for the base cell 140 (see FIG. 1A). A "scan chain" is a method to facilitate testing of the base cell 140 subsequent to fabrication. The method involves coupling the memory block 300 with memory blocks (not shown) of every other base cell 140 of the structured IC chip core 100. The coupled memory blocks (not shown) form a testable function, e.g., a shift register. This testable function enables testing of the connectivity of the truth table inputs I7-I0. The coupled memory units facilitate loading or shifting a test pattern into the coupled memory units or the "scan chain." The coupled memory units (not shown) can then be observed to read out data contained within each memory unit. The input pin 116 (see FIG. 1) of the IC chip core 100 facilitates providing data to the scan chain. The output pin 118 (see FIG. 1) of the IC chip core 100 facilitates reading the data of the chain.

The process 540 begins at step 550. At the step 552, a chain of connected memory blocks, such as the memory block 300 (see FIG. 3) is loaded with data using the scan data pin SD. The chain of connected memory blocks and/or flip flops can be activated by asserting the scan enable pin SE. For example, the memory block 300 is loaded with a zero. At the step 554, the test bus 260 and the memory test bus 360 are decoded for a particular truth table input I7-I0. Using I3 as an example, TA2-TA0=011. In addition, at the step 556, the test enable signal TE is set to TE=1. Also, the scan select signal SS is enabled. All the input pins 116 (see FIG. 1) to the IC chip core 100 are set equal to zero. Then a state on the truth table input I3 is loaded into the memory block 300. The state of truth table input I3 can be read from the memory block 300. The state of truth table input I3 can be read from each of the connected memory blocks in the chain of flip flops (not shown). At the step 558, the scan chain is then read out by reading the value at the output pin 118 of the IC chip core 100.

In this manner every flip flop (not shown) of the IC chip core 100 can be verified as coupled to a logic 1 or 0. The process 540 can be repeated for each of the truth table input I7-I0. The process 540 can then be modified by loading the memory block 300 with a '1' instead of a '0', and setting all the inputs pins 116 (see FIG. 1) to the IC chip core 100 equal to a '1' instead of a '0'. The process 540 facilitates gathering information for a determination of which of the truth table inputs I7-I0 are coupled to Vdd and which of the truth table inputs I7-I0 are coupled to Vss. In addition, the truth table inputs I7-I0 can be coupled to another flip flop (not shown) or the input pin 116 (see FIG. 1) of the IC chip core 100. The process 540 can facilitate determining which of the truth table inputs I7-I0 that are a function of multiple flip flops or multiple input pins (not shown). The process 540 determines which of the truth table inputs I7-I0 are the function of multiple flip flops or multiple inputs pins by loading a logic '1' or a logic '0' in a range of all possible truth table states to the multiple flip flops or multiple input pins. Alternatively, the process 540 can include testing of the capacitance between the power signals Vdd, Vss 112, 114 (see FIG. 1A) and determining a change in capacitance from an expected value.

Referring back to FIG. 4, a physical implementation of the logic cell 400 the combinational logic block 410 comprises the design logic module 412 and the testable logic module 414. The design logic module 412 can be realized using traditional means to synthesize logic structures. The design logic module 412 and testable logic module 414 can be configured using a Derivation Tool or a Place and Route software program. A means to synthesize logic structures can include electronic design automation (EDA), which is a category of tools for designing and producing electronics systems from printed circuit boards to integrated circuits (IC). A software synthesis tool (not shown) among other features is used to transfer the design logic module 412 from an abstract register transfer level (RTL) design to large collection of standard cells. The collection of standard cells and each necessary electrical connection interconnecting the standard cells form a design logic netlist. After forming the design logic netlist for the design logic module 412, the synthesis tool configures all remaining unused logic cells to form a testable function as the testable logic module 314, thus creating a testable logic netlist. For example, all unused logic blocks 120 (see FIG. 1A) and memory blocks 130 (see FIG. 1A) can be configured into a testable function. This testable logic netlist facilitates testing of the connectivity of the logic cell 400. The synthesis tool produces a combined netlist for the design logic module 412 and the testable logic module 414.

A placement tool of the Place and Route software processes the combined netlist to produce a region of standard cells or a die map representing a final ASIC structure, such as the IC chip core 100. The placement tool also establishes a unique location for each logic gate within the die map. A router tool creates signal connect lines and power supply lines that connect each logic gate within the die map. An output of the Place and Route software can be a set of lithography photomasks used to produce physical ICs in a semiconductor fabrication process.

Verification is conducted to insure a reliable device fabrication. Design Rule Check (DRC) is used to verify transistor spacing, metal layer thickness, and power density rules. Any violations are flagged. LVS confirms that the final designed chip layout matches a schematic from an original chip specification. After fabrication of the final ASIC structure similar to the IC chip core 100, an original design netlist can be verified by comparing the original design netlist with a data set produced by the testing process 540 of the FIG. 5.

Figure 6:
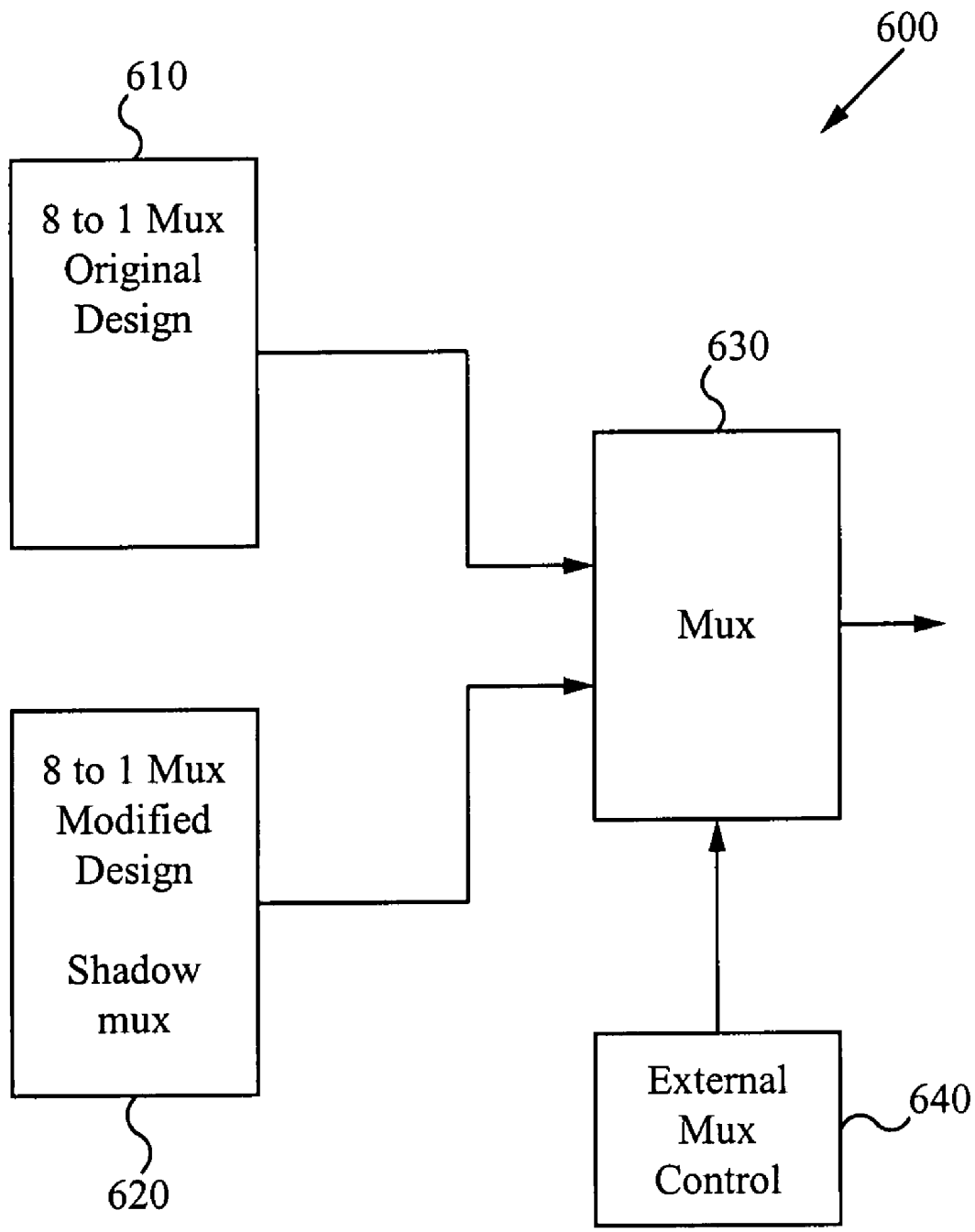
FIG. 6 illustrates subversive logic capable of infecting logic circuits of prior art base cells.

Turning to FIG. 6, a prior art base cell or a shadow cell 600 is shown. The shadow cell 600 nullifies one of the assumptions used in the base cell 140 above, which assumes that the truth table inputs I7-I0 are controllable. An assumed power pin (Vdd or Vss) (not shown) can be surreptitiously utilized as a program control pin, analogous to the program control signals PC2-PC0. The surreptitiously used power pin would control extra logic that is not accessible through the above normal means for the base cell 140. The surreptitious use of the assumed power pin to subvert an original design can be facilitated by utilizing a base cell set (not shown) different from the base cell 140 (as shown in FIG. 1A). However such a different base cell set could not be accomplished through upper metal layer changes only. A cooperative foundry would be necessary to accomplish such changes.

The shadow cell 600 comprises an original design Mux 610, a modified design shadow Mux 620, a 2 to 1 control Mux 630, and an external Mux control 640. The original Mux 610 comprises logic gates which implement an original design as identified in an integrated circuit (IC) functional specification as envisioned by an original designer. The shadow Mux 620 comprises logic gates which alter the original design as envisioned by the original designer. The control Mux 630 acts as a switch asserting either an output of the original Mux 610 or an output of the shadow Mux 620. The external Mux control 640 is a select signal used to pass the output of the shadow Mux 620 instead of the output of the original Mux 610. The external Mux control 640 can be a control signal that is hidden, e.g., within a power pad.

The shadow Mux 620, control Mux 630 and the external Mux control 640 are clandestine circuits that can have been inserted to subvert the original design. These clandestine circuits can be inserted at the foundry level during IC chip fabrication. Testing as described herein would detect these clandestine circuits.

It is preferred that only metal layer processing is performed in fabricating a final ASIC device. It is preferred that non-metal layer processing except for formation of vias occur such that no additional active devices are added to the final ASIC device.

Figure 7:
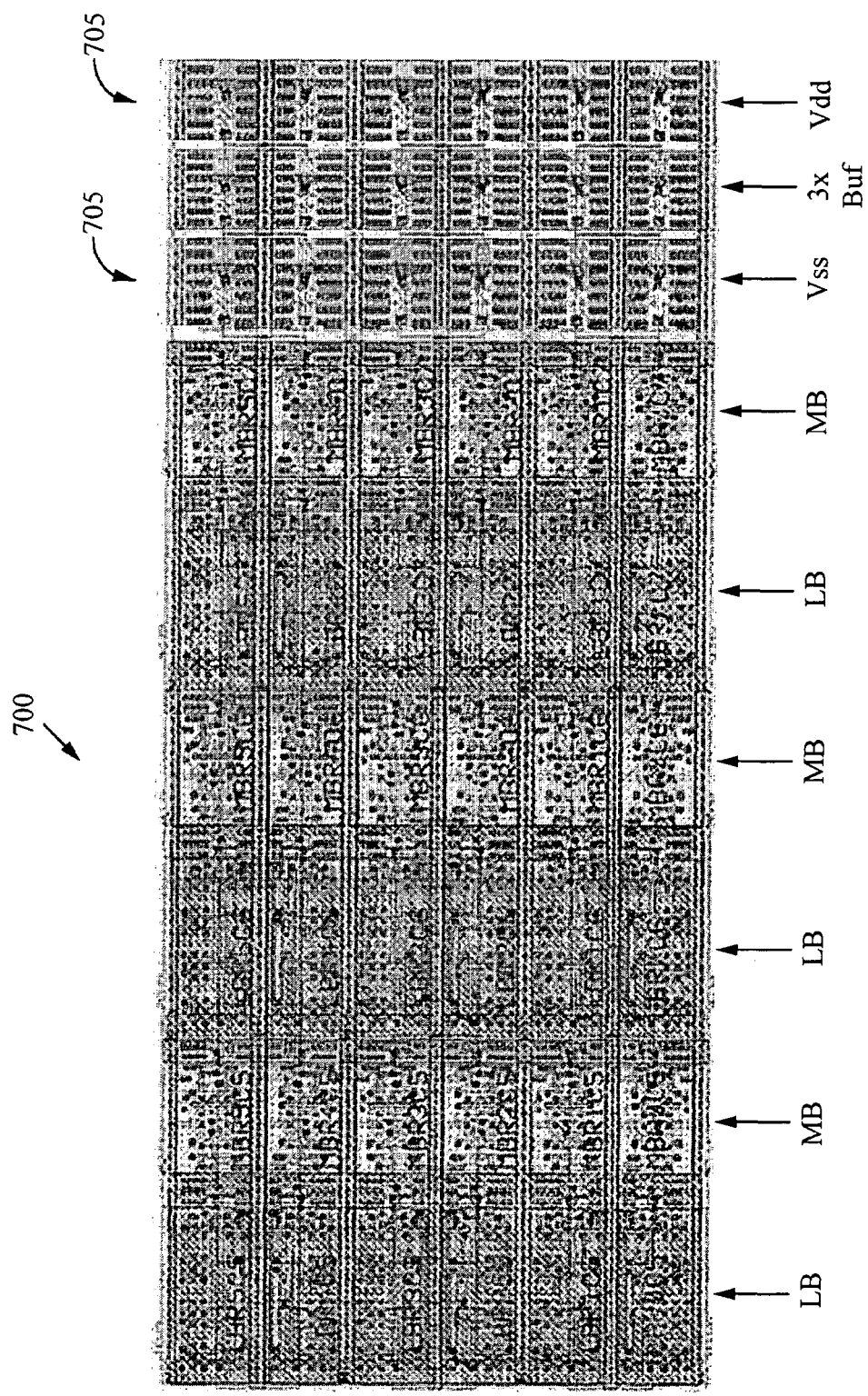
FIGS. 7A-7C illustrate an example layout of a base group of a diagnosable structured ASIC array in accordance with an embodiment of the invention.
Figure 7A:
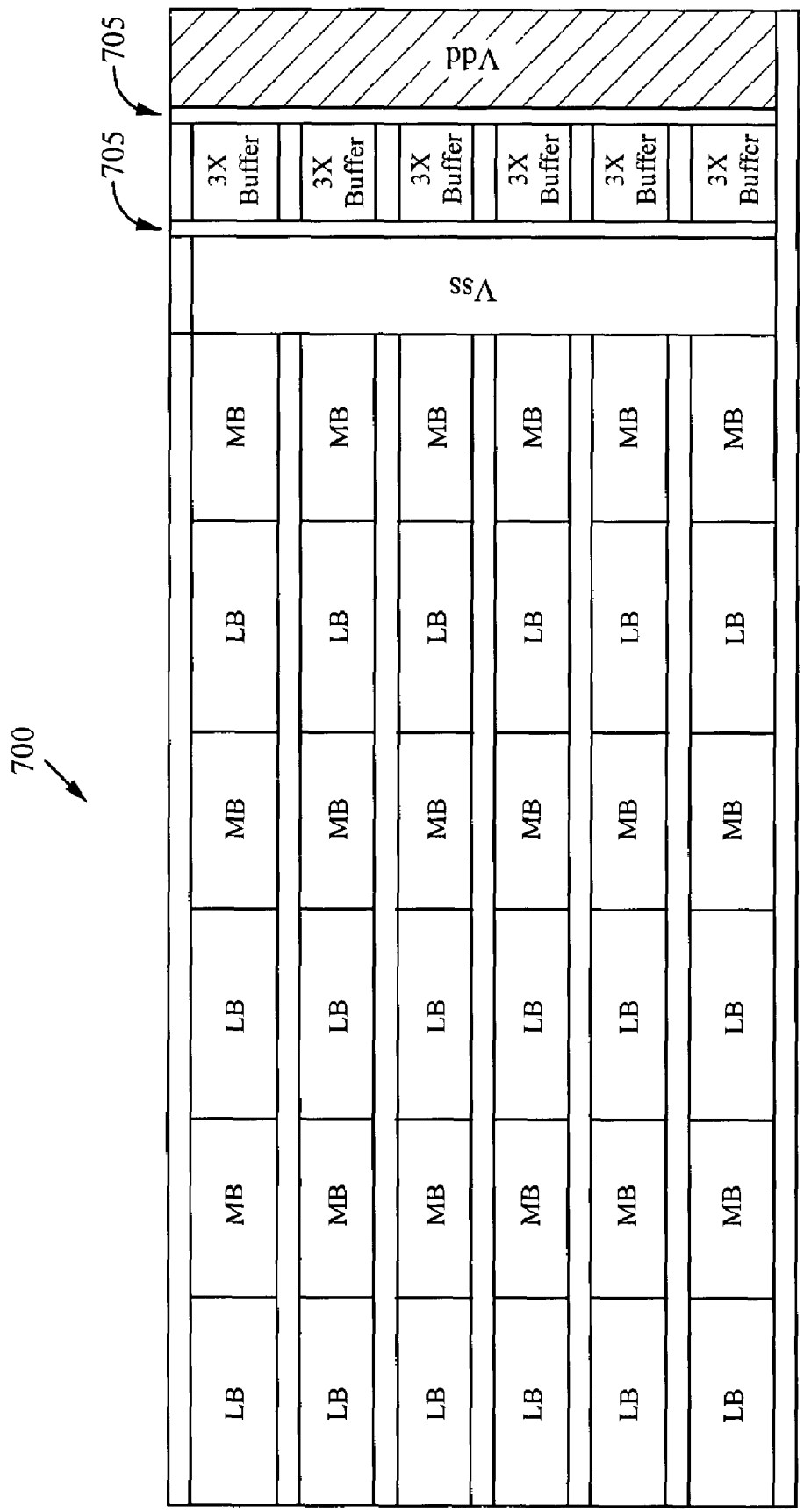
Figure 7B:
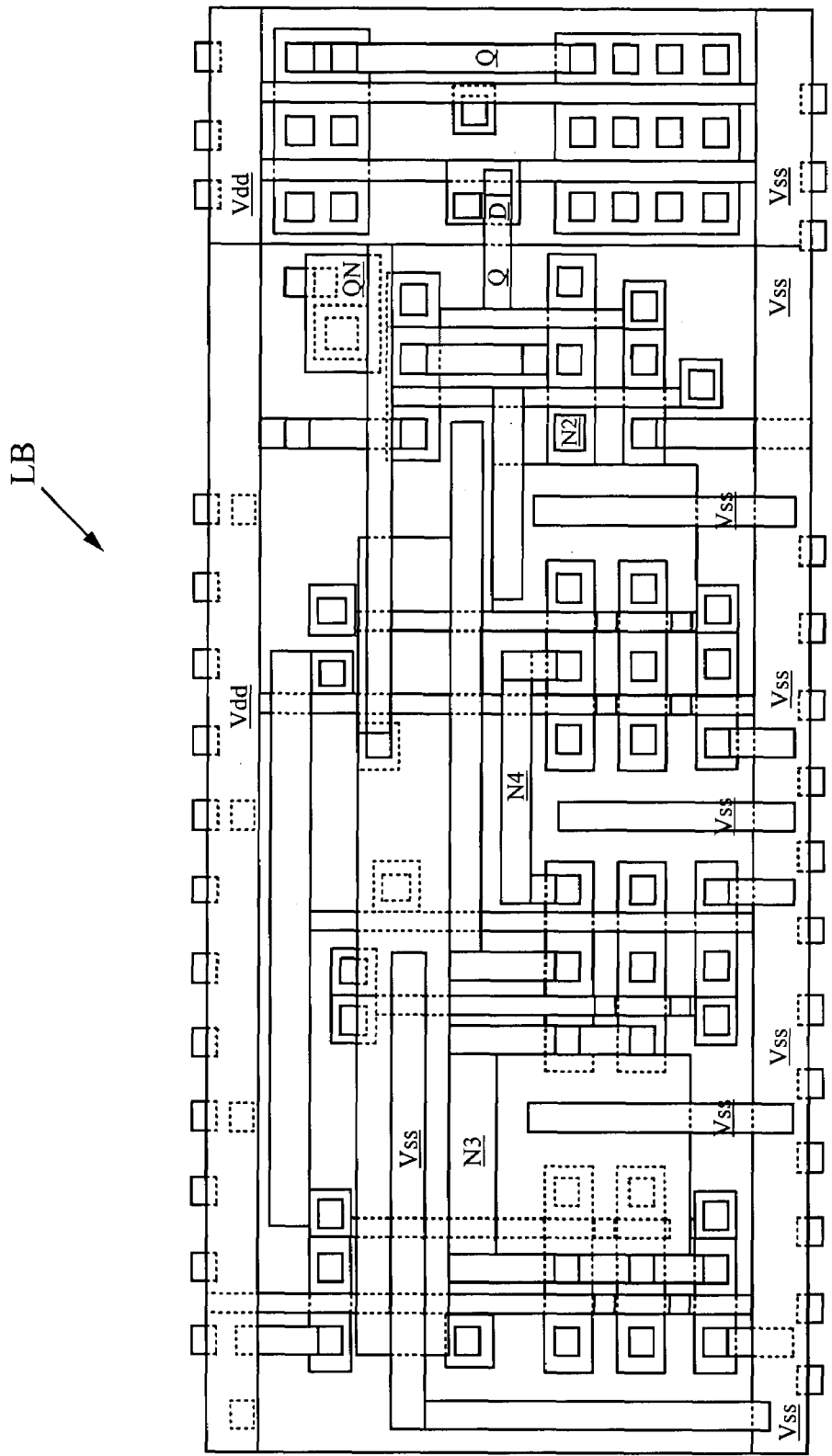
Figure 7C:
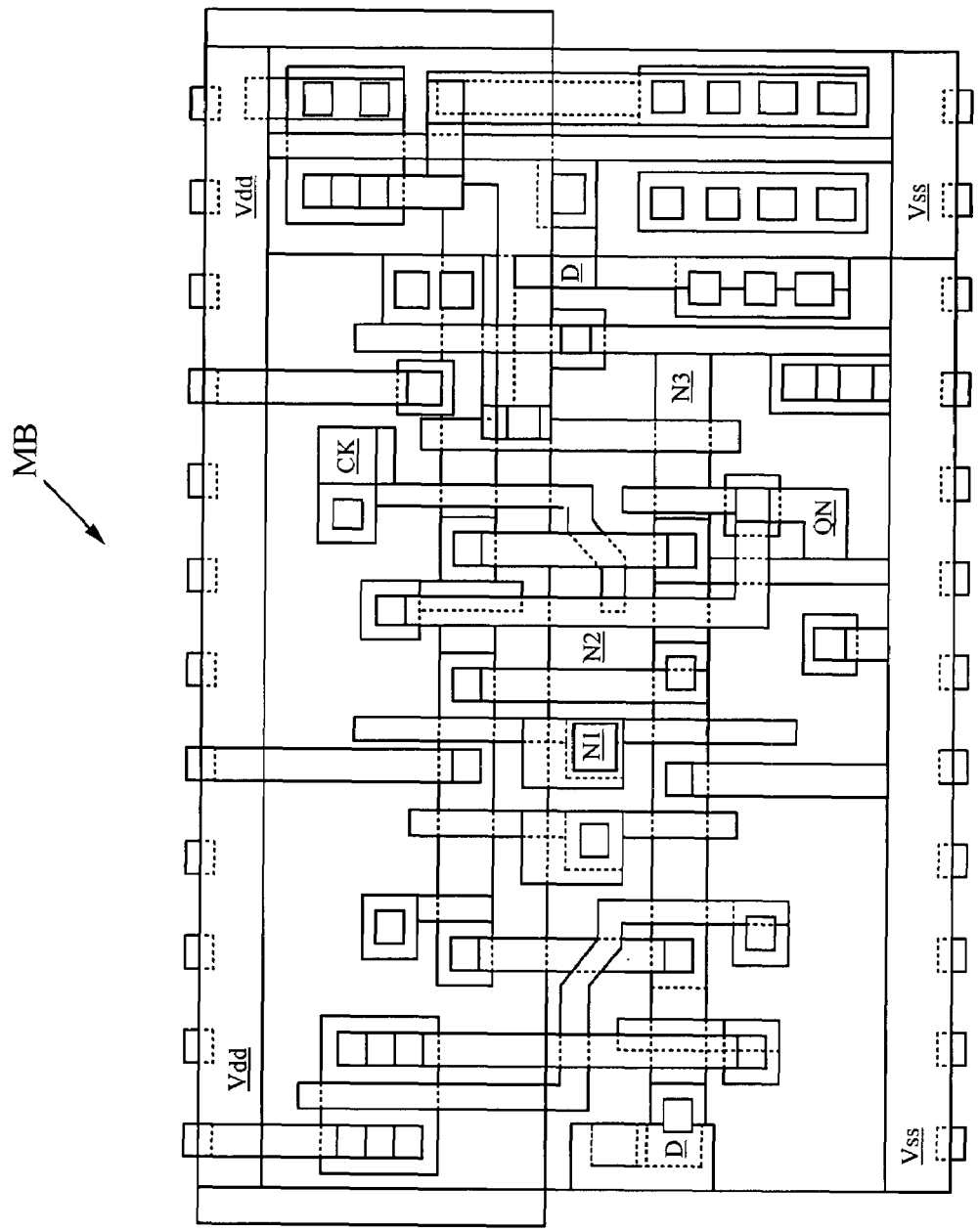

Turning to FIGS. 7A-7C, an example layout of a base group 700 is shown. The base group 700 includes logic blocks LB and memory blocks MB arranged in tandem in 6×4 array. Included in the layout of the base group 700 is Vss lines, Vdd lines and 3× buffers configured between the Vss and Vdd line. The base group 700 can also include filter capacitors 705 configured between the Vss and Vdd lines.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A base cell structure comprising:
    a logic unit comprising a plurality of input nodes, a plurality of selection nodes, and an output node;
    a plurality of switches coupled to the selection nodes, the switches comprising a plurality of input lines, a selection line and an output line;
    a memory cell coupled to the output node; and
    a test address bus and a program control bus coupled to the plurality of input lines and the selection line of the plurality of switches;
    wherein a state on each of the plurality of input nodes is verifiably loaded and read from the memory cell,
    wherein the plurality of switches comprise a triad of multiplexers that are coupled to the selection nodes via the output line of each of the switches.

2. The base cell structure of claim 1, further comprising a test enable signal coupled to the selection line of the plurality of switches.

3. The base cell structure of claim 1, wherein the logic unit comprises an 8×1 multiplexer.

4. The base cell structure of claim 1, wherein the plurality of switches comprise 2×1 multiplexers.

5. A trusted memory block comprising:
    a plurality of switches comprising a plurality of input lines, a selection line and an output line;

a scan D flip flop coupled to the output line of one of the plurality of switches; and a plurality of selection node input signals and a scan data signal coupled to the plurality of input lines and a plurality of memory test address signals and a scan select signal coupled to the selection line of the plurality of switches, wherein the plurality of switches comprise a triad of multiplexers that are arranged in tandem.

6. The trusted memory block of claim 5, further comprising a buffer circuit following the scan D flip flop.

7. The trusted memory block of claim 5, wherein the triad of multiplexers comprise 2 to 1 multiplexers.

8. A logic structure comprising:

an array of trusted logic blocks comprising a logic unit comprising a plurality of input nodes, a plurality of selection nodes, and an output node, a plurality of switches coupled to the selection nodes, the switches comprising a plurality of input lines, a selection line and an output line, and a test address bus and a program control bus coupled to the plurality of input lines and the selection line of the plurality of switches; and an array of trusted memory blocks comprising a plurality of switches comprising a plurality of input lines, a selection line and an output line, a scan D flip flop coupled to the output line of one of the plurality of switches, and a plurality of selection node input signals and a scan data signal coupled to the plurality of input lines and a plurality of memory test address signals and a scan select signal coupled to the selection line of the plurality of switches, wherein the array of trusted logic blocks are coupled with the array of trusted memory blocks via the plurality of selection nodes and the plurality of selection node input signals, respectively.

9. The logic structure of claim 8, wherein each logic block of the array of trusted logic blocks is arranged in tandem with each memory block of the array of trusted memory blocks.

10. The logic structure of claim 8, wherein the logic unit of the array of trusted logic blocks comprises an 8×1 multiplexer.

11. The logic structure of claim 8, further comprising 9× buffers and 3× buffers on a periphery of the logic structure.

12. The logic structure of claim 8, further comprising a buffer circuit following each of the logic units and scan D flip flops.

13. The logic structure of claim 8, further comprising non-logic structures occupying a space of logic structure that is devoid of active logic circuits.

14. The logic structure of claim 13, wherein the non-logic structures comprise filter capacitors.

15. The logic structure of claim 13, further comprising a plurality of unused trusted logic blocks and unused trusted memory blocks configured into a testable function.

16. The logic structure of claim 15, wherein the testable function comprises a shift register.

17. An application specific integrated circuit (ASIC) structure comprising:

an array of base groups each including a logic structure comprising:

an array of trusted logic blocks comprising a logic unit comprising a plurality of input nodes, a plurality of selection nodes, and an output node, a plurality of switches coupled to the selection nodes, the switches comprising a plurality of input lines, a selection line and an output line, and a test address bus and a program control bus coupled to the plurality of input lines and the selection line of the plurality of switches; and an array of trusted memory blocks comprising a plurality of switches comprising a plurality of input lines, a selection line and an output line, a scan D flip flop coupled to the output line of one of the plurality of switches, and a plurality of selection node input signals and a scan data signal coupled to the plurality of input lines and a plurality of memory test address signals and a scan select signal coupled to the selection line of the plurality of switches, wherein the array of trusted logic blocks are coupled with the array of trusted memory blocks via the plurality of selection nodes and the plurality of selection node input signals, respectively; and a plurality of input pins and output pins in communication with each base group.

18. The ASIC structure of claim 17, wherein each logic block of the array of trusted logic blocks is arranged in tandem with each memory block of the array of trusted memory blocks.

19. The ASIC structure of claim 17, wherein the logic unit of the array of trusted logic blocks comprises an 8×1 multiplexer.

20. The ASIC structure of claim 17, further comprising non-logic structures occupying a space of ASIC structure that is devoid of active logic circuits.

21. The ASIC structure of claim 20, wherein the non-logic structures comprise filter capacitors.

22. The ASIC structure of claim 17, further comprising a plurality of unused trusted logic blocks and unused trusted memory blocks configured into a testable function.

23. The ASIC structure of claim 22, wherein the testable function comprises a shift register.

* * * * *